United States Patent
Chen et al.

(10) Patent No.: US 9,837,958 B2
(45) Date of Patent: Dec. 5, 2017

(54) CRYSTAL (XTAL) OSCILLATOR WITH HIGH INTERFERENCE IMMUNITY

(71) Applicant: MaxLinear, Inc., Carlsbad, CA (US)

(72) Inventors: Xuefeng Chen, Carlsbad, CA (US); Hosein Zareie, Carlsbad, CA (US)

( * ) Notice: Subject to any disclaimer, the term of this patent is extended or adjusted under 35 U.S.C. 154(b) by 0 days.

(21) Appl. No.: 15/177,045

(22) Filed: Jun. 8, 2016

(65) Prior Publication Data

US 2016/0359455 A1 Dec. 8, 2016

Related U.S. Application Data

(60) Provisional application No. 62/172,579, filed on Jun. 8, 2015.

(51) Int. Cl.
*H03B 1/04* (2006.01)
*H03B 5/32* (2006.01)

(52) U.S. Cl.
CPC .............. *H03B 1/04* (2013.01); *H03B 5/32* (2013.01)

(58) Field of Classification Search
CPC ............................ H03F 1/3247; H04L 27/368
USPC .................. 375/296, 344; 331/176; 455/41.2
See application file for complete search history.

(56) References Cited

U.S. PATENT DOCUMENTS

| | | | | |
|---|---|---|---|---|
| 2004/0100328 A1* | 5/2004 | Melanson | ................ | H03F 1/26 330/297 |
| 2008/0253485 A1* | 10/2008 | Takashima | ............ | H04N 5/455 375/344 |
| 2010/0277247 A1* | 11/2010 | Kondo | .................... | H03B 5/32 331/50 |
| 2013/0234900 A1* | 9/2013 | Kim | ........................ | H01Q 5/01 343/729 |
| 2013/0257435 A1* | 10/2013 | Smithson | ............ | E21B 47/0905 324/338 |

* cited by examiner

*Primary Examiner* — Khai Tran
(74) *Attorney, Agent, or Firm* — McAndrews, Held & Malloy, Ltd.

(57) ABSTRACT

Systems and methods are provided for a crystal (xtal) oscillator with high interference immunity. Generated reference signals may be processed to mitigate effects of interference. The processing may comprise filtering, particularly at harmonic positions, to remove or greatly reduce interference signals.

20 Claims, 7 Drawing Sheets

CRYSTAL (XTAL) OSCILLATOR WITH HIGH INTERFERENCE IMMUNITY

CLAIM OF PRIORITY

This patent application makes reference to, claims priority to and claims benefit from U.S. Provisional Patent Application Ser. No. 62/172,579, filed Jun. 8, 2015. The identified application is hereby incorporated herein by reference in its entirety.

TECHNICAL FIELD

Aspects of the present disclosure relate to signal processing. More specifically, various implementations of the present disclosure relate to crystal (xtal) oscillator with high interference immunity.

BACKGROUND

Conventional approaches for utilizing crystal (xtal) oscillators (e.g., to provide clocking or other periodic signals) in electronic systems, may be costly, cumbersome, or inefficient. Further limitations and disadvantages of conventional and traditional approaches will become apparent to one of skill in the art, through comparison of such systems with some aspects of the present disclosure as set forth in the remainder of the present application with reference to the drawings.

BRIEF SUMMARY

System and methods are provided for crystal (xtal) oscillator with high interference immunity, substantially as shown in and/or described in connection with at least one of the figures, as set forth more completely in the claims.

These and other advantages, aspects and novel features of the present disclosure, as well as details of an illustrated embodiment thereof, will be more fully understood from the following description and drawings.

DETAILED DESCRIPTION OF THE INVENTION

As utilized herein the terms "circuits" and "circuitry" refer to physical electronic components (e.g., hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z." As utilized herein, the term "exemplary" means serving as a non-limiting example, instance, or illustration. As utilized herein, the terms "for example" and "e.g." set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

Figure 1:
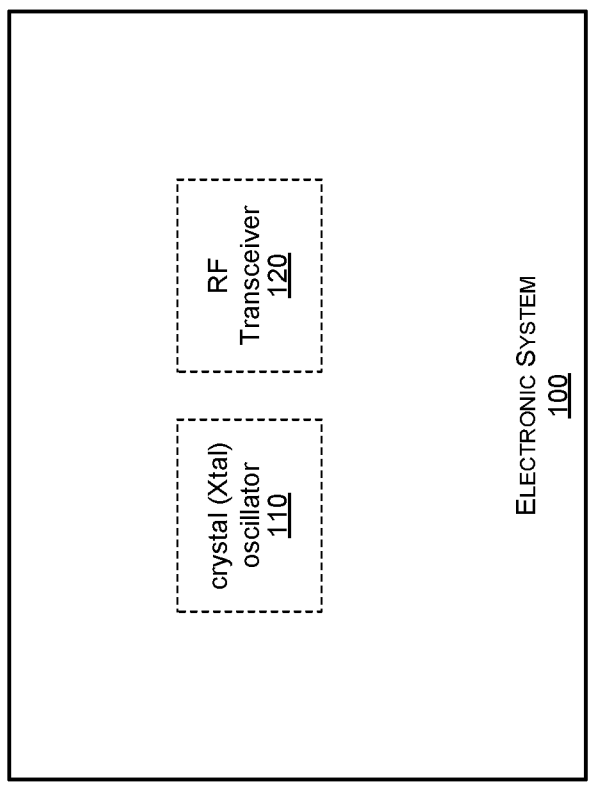
FIG. 1 illustrates an example electronic system that utilizes crystal (xtal) oscillators.

FIG. 1 illustrates an example electronic system that utilizes crystal (xtal) oscillators. Shown in FIG. 1 is an electronic system 100.

The electronic system 100 may comprise suitable circuitry for implementing various aspects of the present disclosure. The electronic system 100 may be configured to support performing, executing or running various operations, functions, applications and/or services. The electronic system 100 may be used, for example, in executing computer programs, playing video and/or audio content, gaming, performing communication applications or services (e.g., Internet access and/or browsing, email, text messaging, chatting and/or voice calling services), providing networking services (e.g., WiFi hotspot, Bluetooth piconet, Ethernet networking, cable or satellite systems, and/or active 4G/3G/femtocell data channels), or the like.

In some instances, the electronic system 100 may enable and/or support communication of data. In this regard, the electronic system 100 may need to communicate with other systems (local or remote), such as during executing, running, and/or performing of operations, functions, applications and/or services supported by the electronic system 100. For example, the electronic system 100 may be configured to support (e.g., using suitable dedicated communication components or subsystems) use of wired and/or wireless connections/interfaces, which may be configured in accordance with one or more supported wireless and/or wired protocols or standards, to facilitate transmission and/or reception of signals (carrying data) to and/or from the electronic system 100. In this regard, the electronic system 100 may be operable to process transmitted and/or received signals in accordance with applicable wired or wireless protocols.

Examples of wireless standards, protocols, and/or interfaces that may be supported and/or used by the electronic system 100 may comprise wireless personal area network (WPAN) protocols, such as Bluetooth (IEEE 802.15); near field communication (NFC) standards; wireless local area network (WLAN) protocols, such as WiFi (IEEE 802.11); cellular standards, such as 2G/2G+ (e.g., GSM/GPRS/EDGE, and IS-95 or cdmaOne) and/or 2G/2G+ (e.g., CDMA2000, UMTS, and HSPA); 4G standards, such as WiMAX (IEEE 802.16) and LTE; Ultra-Wideband (UWB), and/or the like.

Examples of wired standards, protocols, and/or interfaces that may be supported and/or used by the electronic system 100 may comprise Ethernet (IEEE 802.3), Fiber Distributed Data Interface (FDDI), Integrated Services Digital Network (ISDN), cable television and/or internet access standards (e.g., ATSC, DVB-C, DOCSIS, etc.), in-home distribution standards such as Multimedia over Coax Alliance (MoCA), and Universal Serial Bus (USB) based interfaces.

Examples of signal processing operations that may be performed by the electronic system 100 comprise, for example, filtering, amplification, analog-to-digital conversion and/or digital-to-analog conversion, up-conversion/down-conversion (e.g., between different frequency bands), encoding/decoding, encryption/decryption, and/or modulation/demodulation.

In some instances, the electronic system 100 may be configured to enable or support input/output operations, such as to allow user interactions that may be needed for controlling the electronic system 100 or operations thereof (e.g., to allow operators to provide input or commands for controlling location specific marketing, or obtain output or feedback pertaining to it). In this regard, the electronic system 100 may comprise components or subsystems for enabling interactions with a user (e.g., end-user or installer), so as to obtain user input and/or to provide user output.

In some instances, the electronic system 100 may enable or support input/output operations, such as to allow providing output to and/or obtaining input from user(s) of the electronic system 100. In this regard, the electronic system 100 may comprise components or subsystems for enabling obtaining user input and/or to provide output to the user. For example, the electronic system 100 may enable or support input/output operations for allowing user interactions which may be needed for controlling the electronic system 100 or operations thereof (e.g., allowing operators to provide input or commands for controlling certain functions or components, to output or provide feedback pertaining, etc.). The electronic system 100 may also be operable to support input and/or output of multimedia data. For example, the electronic system 100 may enable or support generating, processing, and/or outputting of video and/or acoustic signals, such as via suitable output devices or components (e.g., displays, loudspeakers, etc.). The output signals may be generated based on content, which may be in digital form (e.g., digitally formatted music or the like). Similarly, the electronic system 100 may enable or support capturing and processing of video and/or acoustic signals, such as via suitable input devices or components (e.g., cameras, microphones, etc.), to generate corresponding data. The corresponding data may be in digital form (e.g., digitally formatted music, other audio, video, or the like).

The electronic system 100 may be a stationary system (i.e. being installed at, and/or configured for use only in particular location). In other instances, however, the electronic system 100 may be a mobile device—i.e. intended for use on the move and/or at different locations. In this regard, the electronic system 100 may be designed and/or configured (e.g., as handheld device) to allow for ease of movement, such as to allow it to be readily moved while being held by the user as the user moves, and the electronic system 100 may be configured to perform at least some of the operations, functions, applications and/or services supported on the move.

Examples of electronic systems may include handheld electronic devices (e.g., cellular phones, smartphones, tablets, etc.), computers (e.g., laptops, desktops, servers, etc.), dedicated media devices (e.g., televisions, game consoles, or portable media players, etc.), set-top boxes (STBs) or other similar receiver systems, and the like. The disclosure, however, is not limited to any particular type of electronic system.

In operation, the electronic system 100 may be operable to perform various operations, functions, applications and/or services. Further, the electronic system 100 may comprise suitable components (e.g., circuitry) for enabling and/or supporting the operations, functions, applications and/or services provided thereby. For example, in some instances, electronic system 100 may be operable to communicate (send and/or receive) data, and to process the communicated data. Communication of data, whether over wired or wireless interfaces, may typically comprise transmitting and/or receiving signals that are communicated over wireless and/or wired connections. For example, analog radio frequency (RF) signals may be used to carry data (e.g., content), with the data being embedded into the analog signals in accordance with a particular analog or digital modulation scheme. For analog communications, data is transferred using continuously varying analog signals, and for digital communications, the analog signals are used to transfer discrete messages in accordance with a particular digitalization scheme. Thus, handling of various operations, functions, applications and/or services in the electronic system 100 may typically require performing various signal processing operations, to facilitate reception and/or transmission of signals, generation of signals, extracting of data from (or embedding into) signals, and the like. The electronic system 100 may comprise various components for enabling RF based communications. For example, the electronic system 100 may comprise one or more RF transceivers 120. In this regard, each RF transceiver 120 may comprise suitable circuitry for transmitting and receiving RF signals (e.g., over the air or over wired connectors), and for performing at least some of the processing functions required to facilitate such transmission and/or reception.

In some instances, at least some of the operations performed in the electronic system 100 (and/or the components used in providing such operations) may require particular signals (e.g., control) which may need to be generated within the electronic system 100. For example, some of the components or subsystems of the electronic system 100 may require clock (or other similar periodic) signals, which may be utilized in controlling operations (or clocking/timing thereof) of various components or subsystems in the electronic system 100. Thus, the electronic system 100 may be configured to generate the clock (or other periodic) signals, such as by incorporating dedicated components, which may be utilized in generating (or enabling the generation of) these signals. For example, the electronic system 100 may comprise one or more crystal (xtal) oscillator 110. In this regard, each crystal oscillator 110 may comprise suitable circuitry for creating an electrical signal with a precise frequency based on mechanical resonance of a vibrating crystal (e.g., a piezoelectric material). The frequency of the electrical signal may be used to keep track of time, such as to enable providing a precise and stable basis for triggering the needed clock or other signals in the electronic system 100.

Various architectures and/or designs may be used in implementing crystal (xtal) oscillators and the use thereof in electronic systems. In this regard, in its most basic implementation, a crystal oscillator comprises a crystal (e.g., quartz crystal) which may be specifically selected based on a particular resonant frequency associated therewith, as well as some circuitry for generating electronic signals based on the mechanical resonance of the crystal.

Various issues may exist with conventional approaches for utilizing crystal (xtal) oscillators in electronic systems, however. As noted above, crystal (xtal) oscillators may be utilized in generating periodic signals (e.g., for clock signals, etc.), based on resonant frequency of a crystal, for electronic systems. The crystal (xtal) oscillators and/or functions thereof, however, may be affected by other components and/or functions in the electronic systems. In some instances, the operation of crystal (xtal) oscillators may suffer from and/or be affected by, for example, interference, which may be introduced due to functions of various sub-components the crystal (xtal) oscillators and/or due to operations or functions of other components in the system (e.g., transceivers, such as the transceiver 110 in the electronic system 100).

Accordingly, in various implementations in accordance with the present disclosure, crystal (xtal) oscillators may be designed and/or configured to specifically account for and mitigate particular adverse conditions, such as interference, as described in more detail below.

Figure 2:
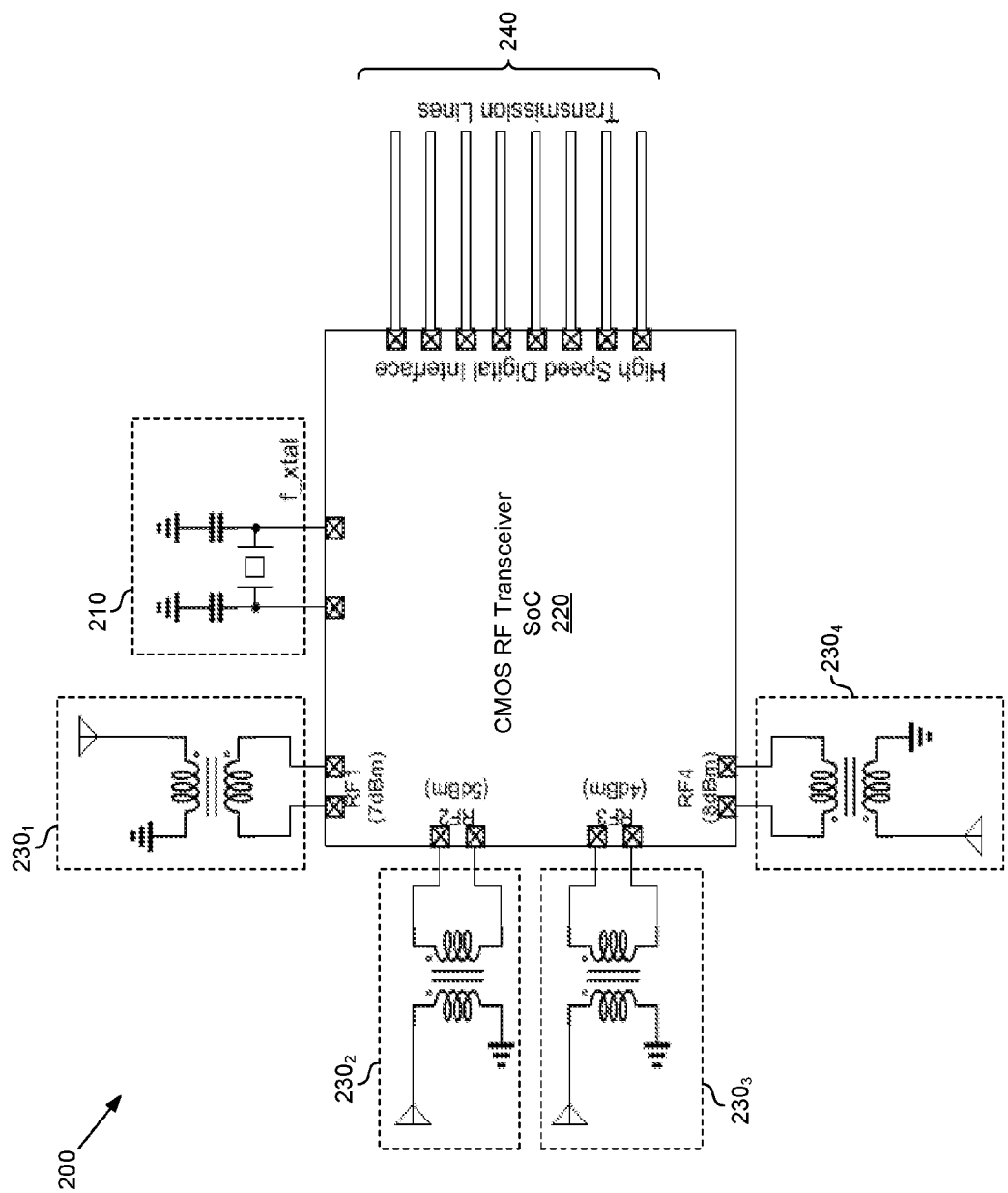
FIG. 2 illustrates an example CMOS radio frequency (RF) transceiver that utilizes a crystal (xtal) oscillator.

FIG. 2 illustrates an example CMOS radio frequency (RF) transceiver that utilizes crystal (xtal) oscillator. Shown in FIG. 2 is an electronic arrangement 200, which may be included in an electronic system (e.g., the electronic system 100 of FIG. 1).

The electronic arrangement 200 may comprise suitable circuitry used in providing and/or performing particular operations and/or functions in the electronic system. The electronic arrangement 200 may be operable to provide and/or perform, for example, RF transmit/receive functions, and/or clocking generation required therefor. For example, as shown in the example implementation depicted in FIG. 2, the electronic arrangement 200 may comprise a crystal (xtal) oscillator 210, a complementary metal-oxide semiconductor (CMOS) radio frequency (RF) transceiver system-on-chip (SoC) 220, and one or more RF front-ends (e.g., 230$_1$-230$_4$). In this regard, the electronic arrangement 200 may represent an example implementation of at least a portion of the combination of the crystal oscillator 110 and the RF transceiver 120 of FIG. 1.

The xtal oscillator 210 may comprise suitable circuitry for creating electrical signals with a particular precise frequency (e.g., f_xtal) based on a crystal included therein (e.g., based on mechanical resonance of the crystal). The signal generated by the xtal oscillator 210 (or, specifically, the frequency f_xtal thereof) may be used to keep track of time, such as to enable providing a precise and stable basis for triggering the needed clock or other signals in the electronic arrangement 200.

The complementary metal-oxide semiconductor (CMOS) radio frequency (RF) transceiver system-on-chip (SoC) 220 may comprise circuitry that handles transmission and reception of RF signals (e.g., over the air or over wired connectors), which may comprise performing at least some of the processing functions required to facilitate such transmission and/or reception. The transceiver CMOS RF transceiver SoC 220 may specifically be implemented using CMOS based, system-on-chip architecture—that is, using a complementary metal-oxide semiconductor based integrated circuit (IC) that integrates all components of the transceiver (including, e.g., digital, analog, radio-frequency related components and functions) on a single chip (substrate).

In some instances, the CMOS RF transceiver SoC 220 may be configured to support multiple RF based communications—e.g., via the (over-the-air) RF front-ends 230$_1$-230$_4$, and via one or more transmission lines 240 (e.g., wired-based) associated with a particular high speed digital interface (e.g., serial link).

In operation, the electronic arrangement 200 may support RF communications, such as via the RF front-ends 230$_1$-230$_4$ and/or the transmission line(s) 240. In this regard, at least some of the operations performed in the electronic arrangement 200 (e.g., RF communication) and/or the components used in providing such operations (e.g., the CMOS RF transceiver SoC 220) may require clock (or other similar periodic) signals, which may be generated using (or based on signals generated by) the xtal oscillator 210. In some instances, however, the operation of xtal oscillator 210 may be subject to interference, which may be introduced within the xtal oscillator 210 itself (e.g., due to functions of various sub-components thereof) and/or due to operations or functions of other components (e.g., the transceiver 220).

For example, the xtal oscillator 210 may have to coexist with multiple high power RF communications (the combination of transceiver 200 the RF front-ends 230$_1$-230$_4$) as well as with communication via the high speed digital interface, at both the chip and the board level, resulting in interference. In this regard, certain functions may be performed or applied during transmission on the chip, which may affect (or even corrupt) the reference signals being outputted by the xtal oscillator (and cause, in some instances, SNR degradation from the transmitted) signal. This may be because these functions may generate signals with sufficiently high energy and are sufficiently close enough to the reference signals (or harmonics thereof) generated by the xtal oscillator 210 to cause interference. For example, a PA (power amplifier), which may output a modulated signal having a higher frequency, may be used in the transmitter(s), the associated energy may get coupled to the crystal oscillator, and if it gets close to the harmonics of the crystal, interference may be introduced. This is explained in more detail with respect to FIGS. 3A and 3B.

Figure 3A:
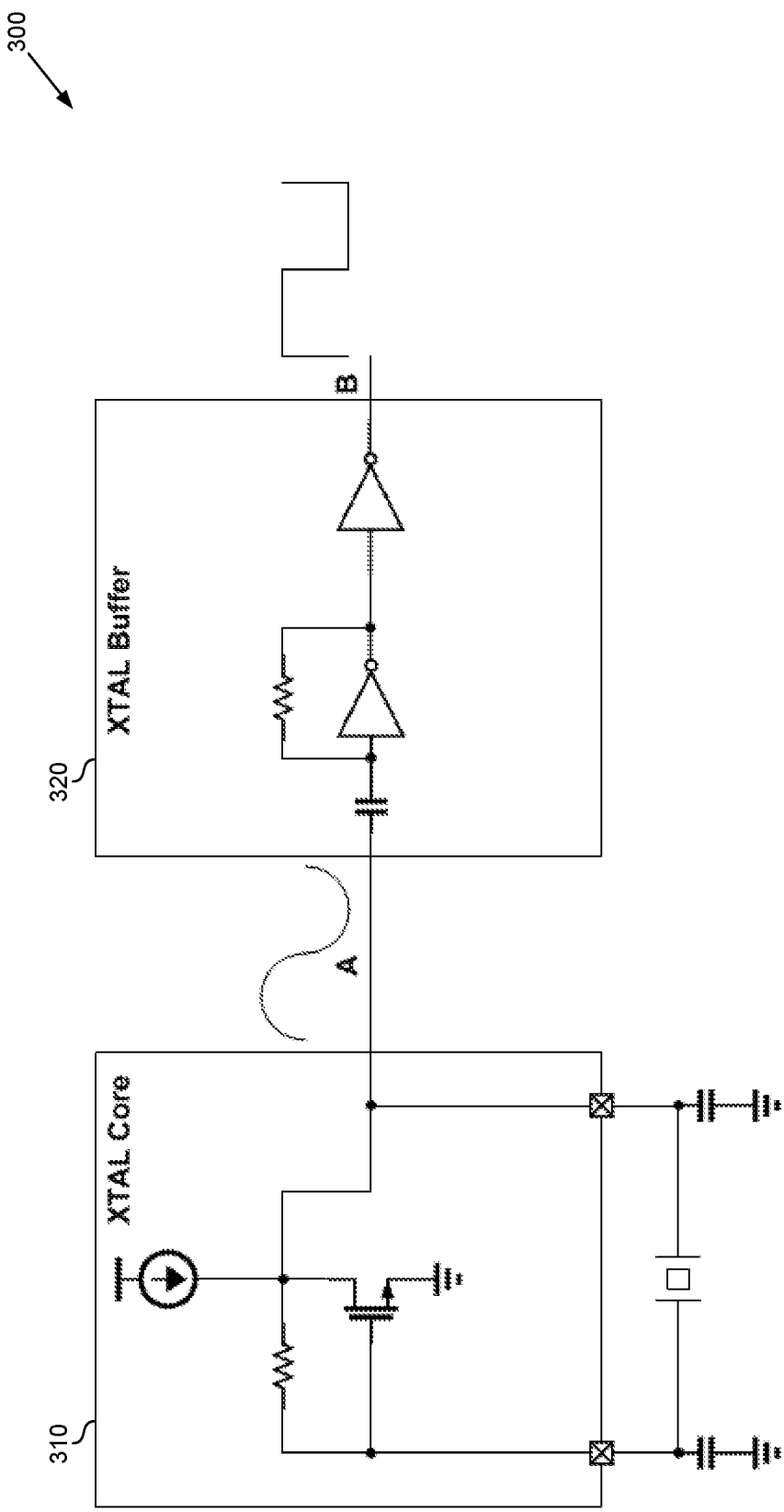
FIG. 3A illustrates an example crystal (xtal) oscillator, in which high frequency interference may occur.

FIG. 3A illustrates an example crystal (xtal) oscillator, in which high frequency interference may occur. Shown in FIG. 3A is a crystal (xtal) oscillator 300.

The xtal oscillator 300 may comprise suitable circuitry for creating reference signals with a particular frequency (e.g., f_xtal) based on a crystal (e.g., based on mechanical resonance of the crystal). The xtal oscillator 300 may correspond to the xtal oscillator 210 of FIG. 2, representing a particular example implementation thereof. In this regard, as shown in FIG. 3A, the xtal oscillator 300 may comprise a xtal core 310 (which comprises the crystal itself as well as circuitry operable to generate electrical signals based on the crystal), and a xtal buffer 320, which may comprise suitable circuitry for post-processing the initial signal generated (via the xtal core 310) based on the crystal. The xtal buffer 320 may be configured to, for example, buffer and digitize the reference signal—that is, convert the analog signals generated based on resonance of the crystal into digital signals that can be used as, e.g., clock signals.

As noted with respect to FIG. 2, in some instances functions performed in the system or components that are coupled to the xtal oscillator may introduce interference. For example, the PA (typically having a modulated signal with high frequency and high energy) may affect the xtal oscillator as the PA energy may leak into the crystal node (particularly the xtal core 310). Such transmission signals (e.g., RF1, RF2, RF3, etc.) may, in some instances, be close to the harmonics of the crystal's reference signal, as further illustrated in FIG. 3B, which shows frequency charts for an example use scenario in the crystal (xtal) oscillator of FIG. 3A.

Figure 3B:
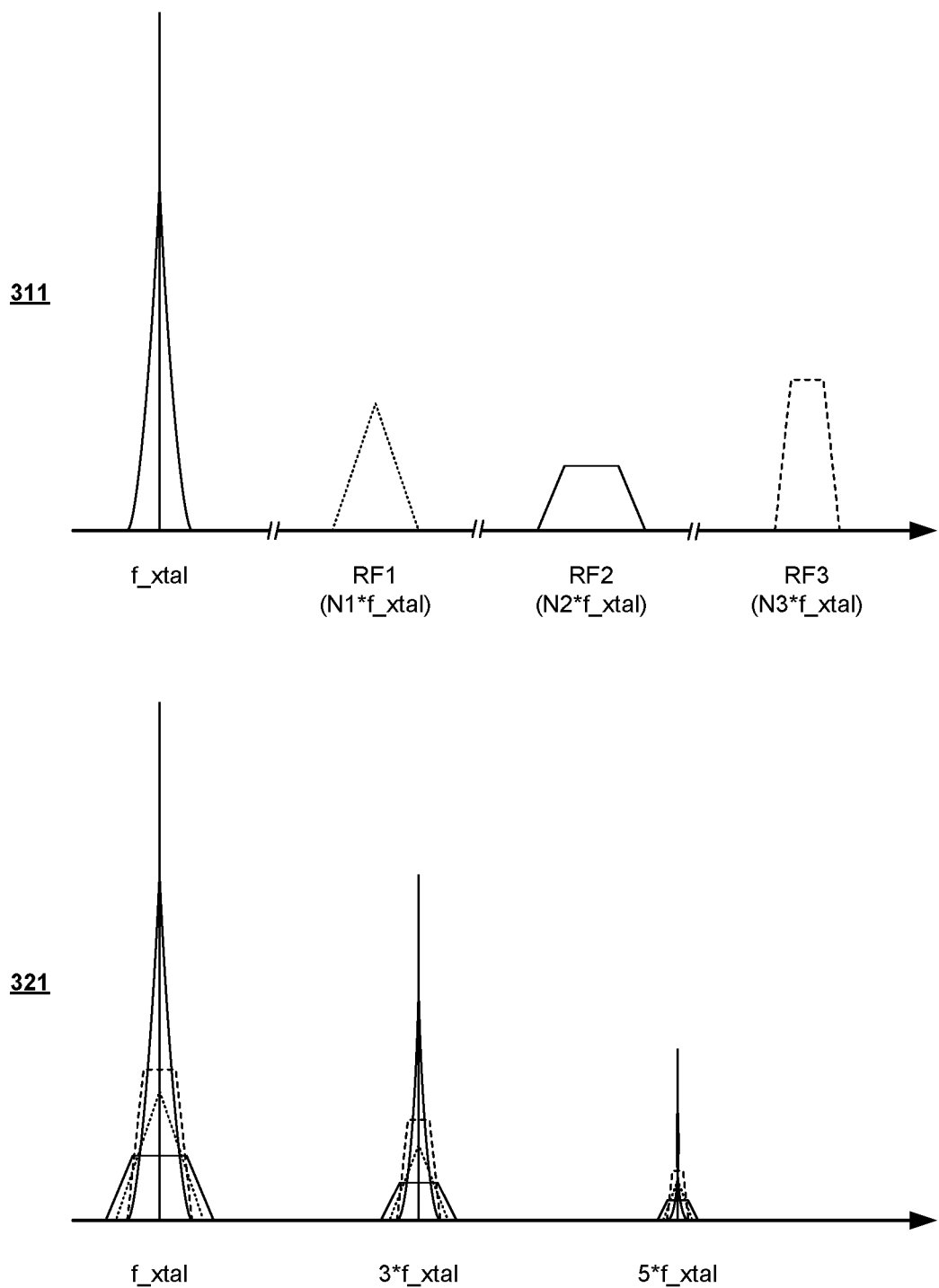
FIG. 3B shows frequency charts for an example use scenario in the crystal (xtal) oscillator of FIG. 3A.

In this regard, the reference signal outputted by the xtal core 310, at point A (as marked in FIG. 3A), may include both the crystal-based signal (at f_xtal) as well as the high power transmission-based interference signals at the harmonics positions (e.g., N1*f_xtal, N2*f_xtal, N3*f_xtal, etc.), as illustrated in frequency chart 311 in FIG. 3B. The mixed signal then may go through and be processed by the xtal buffer 320. The xtal buffer 320 may be a nonlinear circuit. As a result, the high power interference at the multiple harmonics of the xtal oscillator signal's frequency (f_xtal) becomes in-band noise—e.g., due to the squaring action performed by the xtal buffer 320. In this regard, the output signal of the xtal buffer 320 (e.g., square clock signal), at point B (as marked in FIG. 3A) may comprise a mix of the crystal-based signal and strong interference signals at the xtal oscillator signal's frequency (f_xtal), as well as at certain harmonics positions (e.g., N3*f_xtal, N5*f_xtal, etc.), as illustrated in frequency chart 321 in FIG. 3B.

Accordingly, in various implementations in accordance with the present disclosure, measures may be taken to account for and mitigate (e.g., reduce or even eliminate) the effects of any interference signals that may otherwise degrade the performance of crystal oscillators. For example, this may be done by processing the reference signals within the xtal oscillator to clean them up from the interference signals (or effects thereof)—e.g., attenuate the interference signals out. The reference signal generated and outputted by the crystal core may be processed, for example, to remove the interference signals before further processing, such as via the crystal buffer, where characteristics thereof (e.g., nonlinearity) may particularly worsen performance of the oscillator. An example implementation is described with respect to FIGS. 4A and 4B.

Figure 4A:
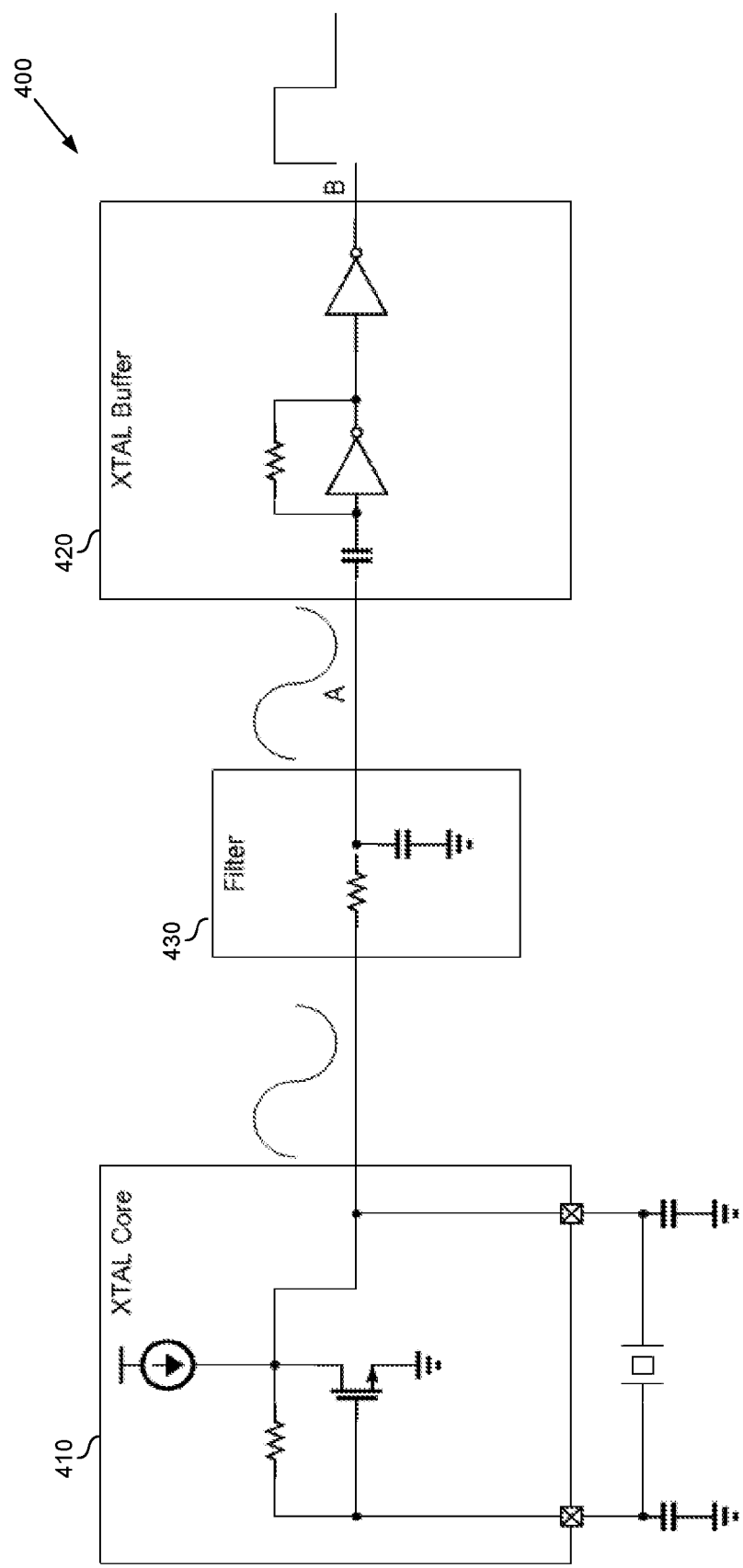
FIG. 4A illustrates an example crystal (xtal) oscillator with high frequency interference immunity.

FIG. 4A illustrates an example crystal (xtal) oscillator with high frequency interference immunity. Shown in FIG. 4A is a crystal (xtal) oscillator 400.

The xtal oscillator 400 may be substantially similar the xtal oscillator 300, operating in substantially similar manner, for example. In particular, the xtal oscillator 400 may also comprise a xtal core 410 and a xtal buffer 420, which may be similar to the xtal core 310 and a xtal buffer 320. The xtal oscillator 400 may additionally comprise, however, a xtal filter 430. In this regard, the xtal filter 430 may comprise suitable circuitry for filtering output portions of the output signals where interference may be introduced.

For example, the xtal filter 430 may be a low-pass filter configured to pass the signal at the xtal oscillator signal's frequency (f_xtal), while filtering out higher frequencies, including the harmonics' frequencies (e.g., N1*f_xtal, N2*f_xtal, N3*f_xtal, etc.) in particular, for example. The xtal filter 430 may be implemented, for example (as shown in the example implementation depicted in FIG. 4A), as a resistor-capacitor (RC) circuit (arranged in the particular manner shown in FIG. 4A).

Figure 4B:
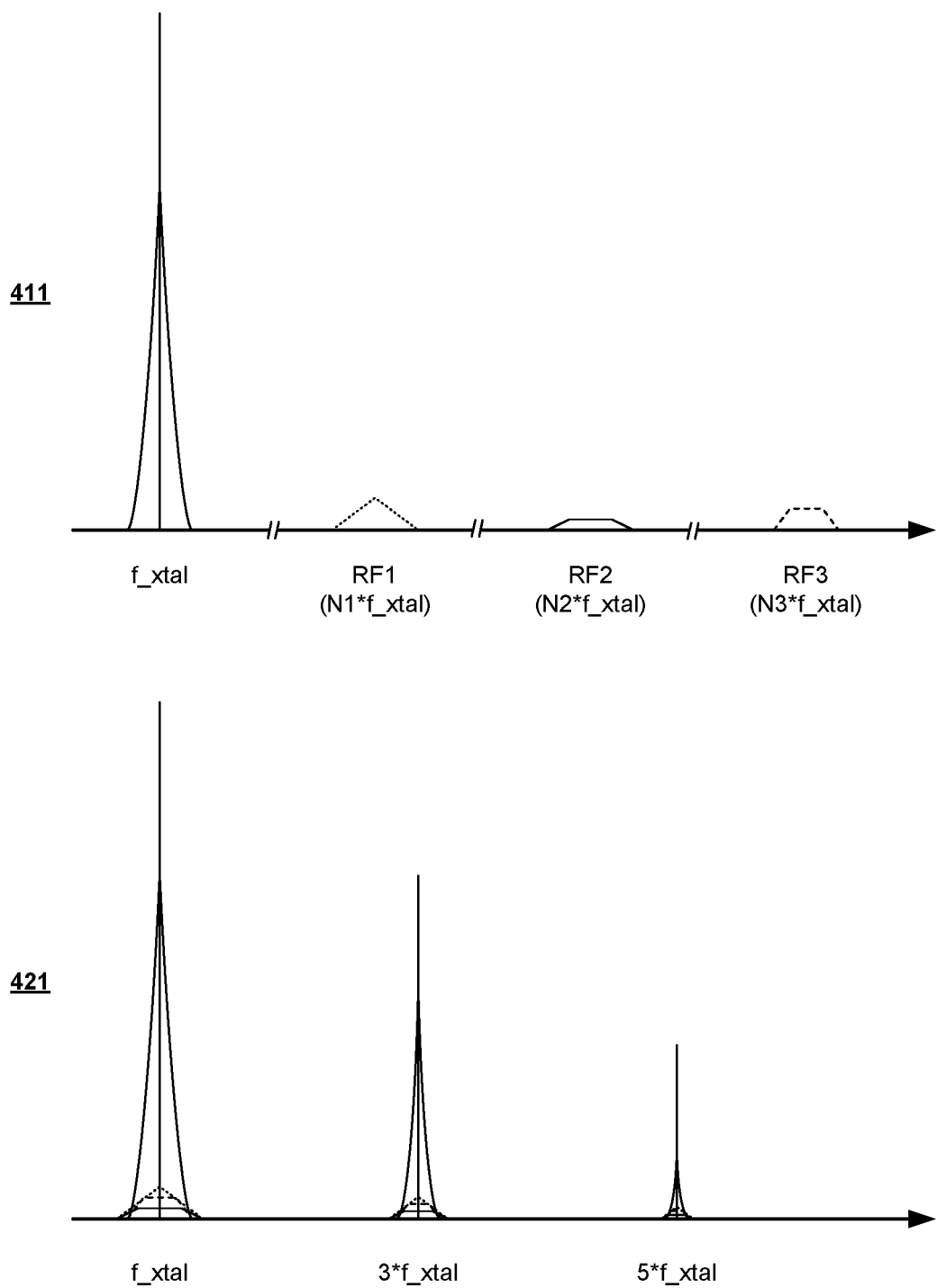
FIG. 4B shows frequency charts for an example use scenario in the crystal (xtal) oscillator of FIG. 4A.

In operation, the xtal filter 430 may effectively filter out (at least most) of high power interference signals which may be introduced into the reference signal generated using the xtal core 410, particularly interference signals that may fall at harmonics positions, as further illustrated in FIG. 4B, which shows frequency charts for an example use scenario in the crystal (xtal) oscillator of FIG. 4A.

For example, as illustrated in FIG. 4A, the signal being fed into the xtal buffer 420 from the xtal core 410, after processing via the xtal filter 430, at point A (as marked in FIG. 4A) includes the crystal-based signal (at f_xtal) and only minimal (negligible) interference signals at the harmonics positions (e.g., N1*f_xtal, N2*f_xtal, N3*f_xtal, etc.), as illustrated in frequency chart 411 in FIG. 4B.

As a result, the output signal of the xtal buffer 420 (e.g., square clock signal), at point B (as marked in FIG. 4A) may comprise mostly (or wholly) the crystal-based signal, with very minimal, if any, interference signals at the xtal oscillator signal's frequency (f_xtal), as well as at certain harmonics positions (e.g., N3*f_xtal, N5*f_xtal, etc.), as illustrated in frequency chart 421 in FIG. 4B.

Figure 5:
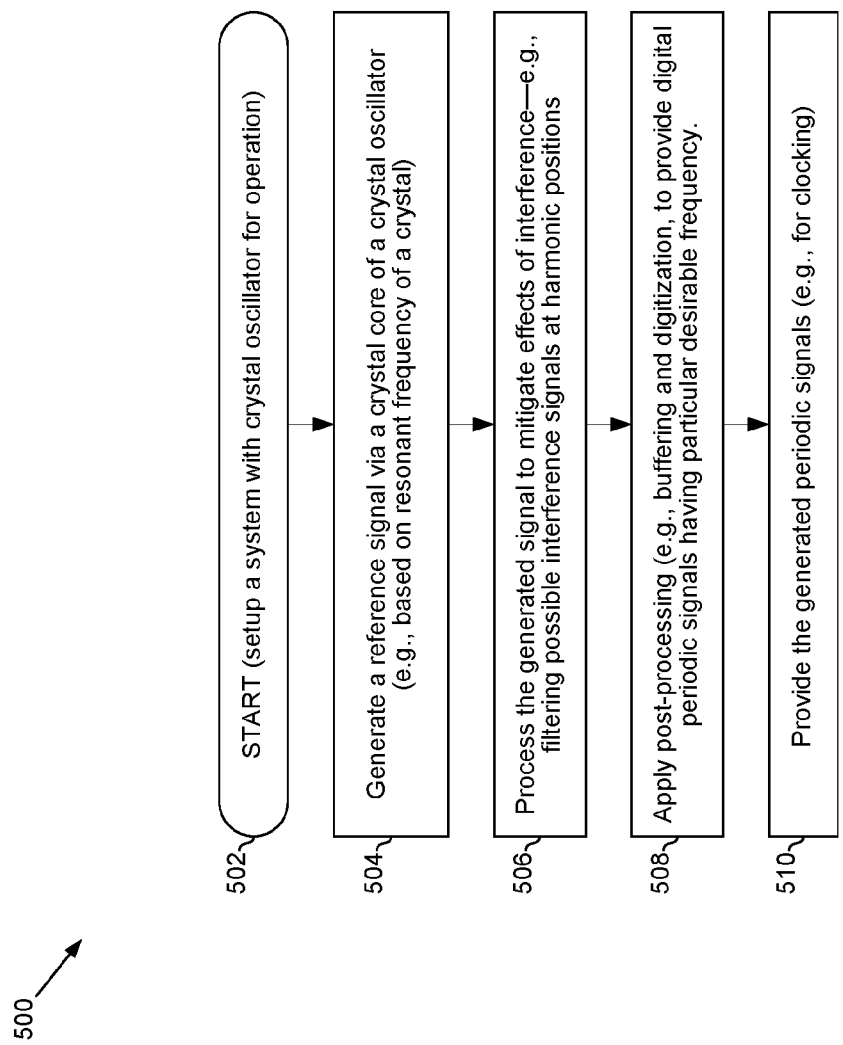
FIG. 5 illustrates a flowchart of an example process for handling crystal (xtal) oscillator with high interference immunity.

FIG. 5 illustrates a flowchart of an example process for handling crystal (xtal) oscillator with high interference immunity. Shown in FIG. 5 is flow chart 500, comprising a plurality of example steps (represented as blocks 502-510), for handling crystal (xtal) oscillator with high interference immunity (e.g., electronic arrangement 200 of FIG. 2), in accordance with the present disclosure.

In start step 502, an electronic system comprising (or utilizing) a crystal oscillator may be configured for operation, such by performing necessary setup and/or configuration functions.

In step 504, a reference signal may be generated, such as via a crystal core (e.g., xtal core 410) of the crystal oscillator (e.g., based on resonant frequency of the crystal core). For example, the reference signal may have a resonant frequency of f_xtal.

In step 506, the generated signals may be processed to mitigate effects of interference, such as by filtering possible interference signals at harmonic positions based on the frequency of the reference signals (e.g., at positions N1*f_xtal, N2*f_xtal, N3*f_xtal, etc.).

In step 508, post-processing (e.g., buffering and digitization) may be applied, such as to provide digital periodic signals having particular desirable frequency.

In step 510, the generated signals may be provided—e.g., for clocking.

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the processes as described herein.

Accordingly, various embodiments in accordance with the present invention may be realized in hardware, software, or a combination of hardware and software. The present invention may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip.

Various embodiments in accordance with the present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method comprising:
in a crystal oscillator that provides periodic signals for an electronic system associated with the crystal oscillator:
generating signals periodically based on resonance of a crystal core of the crystal oscillator, the generated signals having a particular resonant frequency; and
processing the generated signals to mitigate effects of interference introduced by other operations and/or components of the electronic system, wherein the processing is configured based on the particular resonant frequency.

2. The method of claim 1, wherein the other operations and/or components of the electronic system comprise transmissions of radio frequency (RF) signals.

3. The method of claim 1, wherein processing the generated signals to mitigate effects of interference comprises applying filtering based on the particular resonant frequency.

4. The method of claim 3, comprising configuring the filtering to filter out interference signals at harmonics positions of the particular resonant frequency.

5. The method of claim 1, comprising applying post-processing to the generated signals after the processing for mitigating effects of interference.

6. The method of claim 5, wherein the post-processing comprises digitizing the generated signals, to generate corresponding digital periodic signals.

7. A system comprising:
a crystal oscillator that provides periodic signals for the system, wherein the crystal oscillator is operable to:
generate signals periodically based on resonance of a crystal core, the generated signals having a particular resonant frequency; and
process the generated signals to mitigate effects of interference introduced by other operations and/or components of the system, wherein the processing is configured based on the particular resonant frequency.

8. The system of claim 7, wherein the other operations and/or components of the system comprise transmissions of radio frequency (RF) signals.

9. The system of claim 7, wherein processing the generated signals to mitigate effects of interference comprises applying filtering based on the particular resonant frequency.

10. The system of claim 9, wherein the crystal oscillator is operable to filter out interference signals at harmonics positions of the particular resonant frequency.

11. The system of claim 7, wherein the crystal oscillator is operable to apply post-processing to the generated signals after the processing for mitigating effects of interference.

12. The system of claim 11, wherein the post-processing comprises digitizing the generated signals, to generate corresponding digital periodic signals.

13. A crystal oscillator that provides periodic signals, the crystal oscillator comprising:
a crystal core operable to generate signals periodically based on resonance associated with the crystal core, the generated signals having a particular resonant frequency; and
a processing circuit operable to process the generated signals to mitigate effects of interference introduced by other operations and/or components of an electronic system comprising or associated with the crystal oscillator, wherein the processing is configured based on the particular resonant frequency.

14. The crystal oscillator of claim 13, wherein the other operations and/or components of the electronic system comprise transmissions of radio frequency (RF) signals.

15. The crystal oscillator of claim 13, wherein the processing circuit comprises a filtering circuit operable to apply to the generated signals filtering based on the particular resonant frequency.

16. The crystal oscillator of claim 15, wherein the filtering circuit is operable to filter out interference signals at harmonics positions of the particular resonant frequency.

17. The crystal oscillator of claim 15, wherein the filtering circuit comprises a resistor-capacitor (RC) circuit.

18. The crystal oscillator of claim 13, further comprising a post-processing circuit operable to apply post-processing to the generated signals after processing for mitigating effects of interference.

19. The crystal oscillator of claim 18, wherein the post-processing circuit is operable to digitize the generated signals, to generate corresponding digital periodic signals.

20. The crystal oscillator of claim 18, wherein the post-processing circuit is operable to buffer the generated signals.

* * * * *